(12) United States Patent
Srinivasan et al.

(10) Patent No.: US 8,008,162 B2
(45) Date of Patent: Aug. 30, 2011

(54) SELECT DEVICES INCLUDING AN OPEN VOLUME, MEMORY DEVICES AND SYSTEMS INCLUDING SAME, AND METHODS FOR FORMING SAME

(75) Inventors: Bhaskar Srinivasan, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/274,181

(22) Filed: Nov. 19, 2008

(65) Prior Publication Data

US 2010/0123122 A1 May 20, 2010

(51) Int. Cl.
*H01L 21/20* (2006.01)
(52) U.S. Cl. .............. 438/397; 438/396; 257/E21.008
(58) Field of Classification Search .......... 257/25, 257/E21.003, E21.008; 438/397, 421, 422, 438/979, 396
See application file for complete search history.

(56) References Cited

U.S. PATENT DOCUMENTS

| | | | | |
|---|---|---|---|---|
| 5,654,222 | A | * | 8/1997 | Sandhu et al. ............... 438/3 |
| 5,869,379 | A | * | 2/1999 | Gardner et al. ............. 438/305 |
| 6,015,746 | A | | 1/2000 | Yeh et al. |
| 6,064,107 | A | | 5/2000 | Yeh et al. |
| 6,127,251 | A | * | 10/2000 | Gardener et al. ............ 438/585 |
| 6,350,628 | B1 | | 2/2002 | Cheng et al. |
| 6,534,784 | B2 | | 3/2003 | Eliasson et al. |
| 6,635,967 | B2 | | 10/2003 | Chang et al. |
| 6,894,357 | B2 | * | 5/2005 | Guo ............................. 257/410 |
| 6,927,461 | B2 | * | 8/2005 | Kim et al. .................... 257/382 |
| 6,944,052 | B2 | | 9/2005 | Subramanian et al. |
| 7,060,584 | B1 | * | 6/2006 | Carns et al. .................. 438/354 |
| 7,091,052 | B2 | | 8/2006 | Liu |
| 7,173,275 | B2 | | 2/2007 | Estes et al. |
| 7,349,187 | B2 | | 3/2008 | Parkin |
| 7,388,276 | B2 | | 6/2008 | Estes |
| 2004/0038489 | A1 | * | 2/2004 | Clevenger et al. ........... 438/303 |
| 2004/0201057 | A1 | | 10/2004 | Lien et al. |
| 2005/0062074 | A1 | | 3/2005 | Lung |
| 2006/0038293 | A1 | | 2/2006 | Rueger et al. |

OTHER PUBLICATIONS

International Search Report, International Application No. PCT/US2009/063761, mailed Jun. 11, 2010, three (3) pages.
Written Opinion of the International Searching Authority, International Application No. PCT/US2009/063761, mailed Jun. 11, 2010, four (4) pages.
Rockwell et al., Characterization and Modeling of Metal/Double-Insulator/Metal Diodes for Millimeter Wave Wireless Receiver Applications, Jun. 3-5, 2007, 4 pages.

* cited by examiner

*Primary Examiner* — Lex Malsawma
*Assistant Examiner* — Robert Huber
(74) *Attorney, Agent, or Firm* — TraskBritt

(57) ABSTRACT

Select devices including an open volume that functions as a high bandgap material having a low dielectric constant are disclosed. The open volume may provide a more nonlinear, asymmetric I-V curve and enhanced rectifying behavior in the select devices. The select devices may comprise, for example, a metal-insulator-insulator-metal (MIIM) diode. Various methods may be used to form select devices and memory systems including such select devices. Memory devices and electronic systems include such select devices.

20 Claims, 8 Drawing Sheets

US 8,008,162 B2

SELECT DEVICES INCLUDING AN OPEN VOLUME, MEMORY DEVICES AND SYSTEMS INCLUDING SAME, AND METHODS FOR FORMING SAME

TECHNICAL FIELD

Embodiments of the invention generally relate to select devices, such as metal-insulator-insulator-metal (MIIM) diodes, that include an open volume, memory devices and electronic systems including such select devices, and to methods of fabricating such select devices.

BACKGROUND

A metal-insulator-insulator-metal (MIIM) diode includes two electrical insulators disposed between two types of metals. The materials are tailored such that responsive to application of a forward bias, a quantum well forms between the two insulators enabling high-energy quantum tunneling. As a result, when a voltage is applied to the top metal that exceeds its threshold, tunneling electrons are accelerated across the quantum well. Quantum tunneling is faster than charging a switch junction in an integrated circuit, partially because charge travels through the metal rather than slower speed materials such as silicon.

MIIM diodes can be broadly incorporated within circuits that use conventional CMOS manufacturing as well as other semiconductor and printed circuit technologies. The MIIM diode has a sharper forward current-to-voltage (I-V) curve than the metal-insulator-metal (MIM) diode and, thus, may be used as a tunneling device with very high-speed performance capability that is potentially compatible with many substrate technologies. Use of MIIM diodes may potentially reduce cost, size, and improve performance of high-speed memory devices.

However, the insulator materials used in MIIM diodes must be relatively thin compared to the de Broglie electron wavelength and, thus, conventional deposition processes may cause undesirable chemical intermixing at the interface of the metals and insulators. Moreover, for the MIIM to function as a diode, there must be a preferred tunneling direction that results in a sharp bend in the diode forward characteristic current-voltage (I-V) curve. As a result of the high electric fields at the contact periphery or interface current caused by electron traps at the metal-insulator interface, significant edge leakage may occur in MIIM diodes. Due to high leakage currents, MIIM diodes may generally exhibit poor rectifying behavior. Increased asymmetry and nonlinearity in the I-V performance as might be achieved through avoidance of the aforementioned chemical intermixing and edge leakage exhibited by select devices as exemplified by conventional MIIM diodes would result in better rectification performance of such devices.

In view of the above, there is a need in the art for select devices that may be scaled to smaller sizes while exhibiting an increased asymmetrical I-V curve and associated improved rectifying behavior, as well methods of forming such select devices.

DETAILED DESCRIPTION

As discussed in further detail below, in some embodiments, the present invention comprises methods of fabricating select devices, such as metal-insulator-insulator-metal (MIIM) devices, including an open volume that functions as an insulator. In additional embodiments, the present invention comprises memory devices and electronic systems that include one or more such select devices. The one or more such select devices may be in electrical communication with a memory cell to form a memory device. In other embodiments, the present invention includes methods of forming such select devices. Such methods may include forming an open volume between a conductive material and an insulator material, the open volume functioning as a high bandgap insulator having a low dielectric constant.

The term "select device," as used herein, means and includes a device that may operate as a switch that is either in an "off" state or an "on" state depending on the amount of voltage potential applied and, more particularly, switches to the on state when the applied current reaches a threshold or current voltage and in the off state may exhibit a substantially electrically nonconductive state.

As used herein, the term "substrate" means any structure that includes a layer of semiconductor type material including, for example, silicon, germanium, gallium arsenide, indium phosphide, and other III-V or II-VI type semiconductor materials. Substrates include, for example, not only conventional substrates but also other bulk semiconductor substrates such as, by way of nonlimiting example, silicon-on-insulator (SOI) type substrates, silicon-on-sapphire (SOS) type substrates, and epitaxial layers of silicon supported by a layer of base material. Semiconductor type materials may be doped or undoped. Furthermore, when reference is made to a "substrate" in the following description, previous process steps may have been utilized to at least partially form elements or components of a circuit or device in or over a surface of the substrate.

The illustrations presented herein are not meant to be actual views of any particular select device, memory device, memory cell, or system, but are merely idealized representations that are employed to describe the present invention. Additionally, elements common between figures may retain the same numerical designation.

Figure 1A:
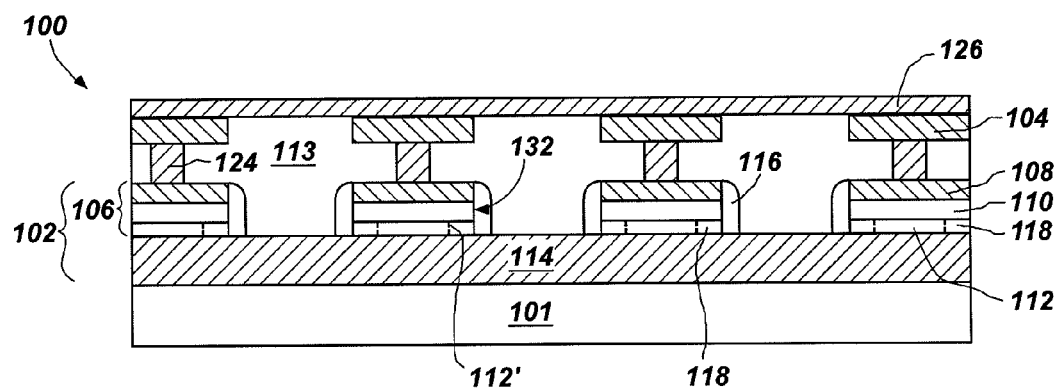
FIG. 1A is a partial cross-sectional side view illustrating an embodiment of a memory device of the present invention including select devices according to the present invention.

FIG. 1A is a partial cross-sectional schematic view of an embodiment of a memory device 100 of the present invention. The memory device 100 may include an integrated circuit comprising a plurality of select devices 102, each of which is coupled to a memory cell 104. In some embodiments, the select devices 102 and memory cells 104 may be arranged in an array on or in a substrate 101. By way of example and not limitation, the select devices 102 may be arranged in a plurality of rows and columns. FIG. 1A is a partial cross-sectional view taken vertically through the substrate 101 and illustrates four select devices 102 in a common row or column of the array.

Each of the select devices 102 may include conductive material 114, and a structure 106 disposed thereon, the structure 106 comprising an optional dielectric material 112, another dielectric material 110, another conductive material 108, and at least one open volume 118 within the select device 102. To facilitate illustration, the select devices 102 are shown in FIG. 1A as occupying a major vertical portion of the substrate 101. It is understood, however, that in actuality the substrate 101 may be relatively thicker than illustrated, and the select devices 102 may occupy a relatively thinner portion of the substrate 101. Furthermore, only active elements of the select devices 102 (i.e., the elements of the select devices 102 through which charge carriers travel), or materials used to form such active elements, are cross-hatched to simplify the cross-sectional figures herein.

The select devices 102 may be disposed, for example, within another dielectric material 113. Each select device 102 may, optionally, be in physical or electrical contact with memory cell 104 via, for example, a conductive contact 124. In some embodiments, each select device 102 may communicate electrically with a memory cell 104 by way of a conductive contact 124, and each memory cell 104 may communicate electrically with a conductive line 126. As a non-limiting example, each of the memory cells 104 may include a charge-based memory cell or a phase change memory cell. Each select device 102 may also communicate electrically with another conductive line (not shown) by way of electrical contacts (not shown). In additional embodiments, the conductive material 114 may simply comprise a region or portion of another conductive line.

Figure 1B:
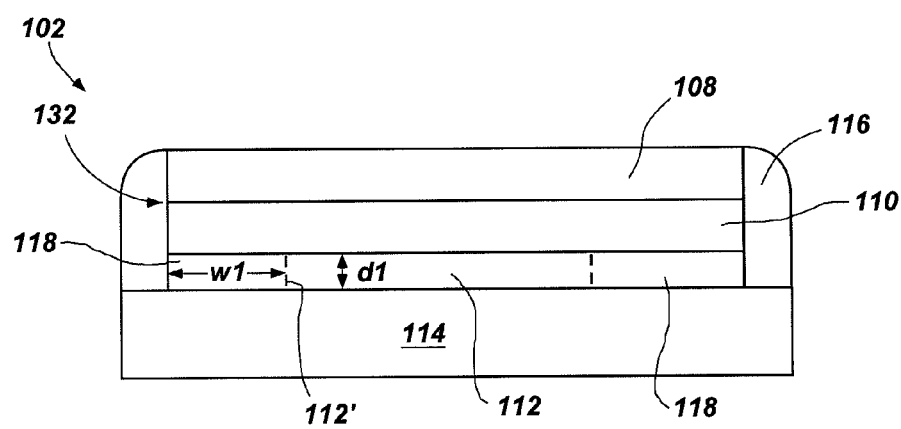
FIG. 1B shows electrodes, insulators and spacers of one select device shown in FIG. 1A and is used to illustrate one manner of operation thereof.

FIG. 1B is an enlarged view of the conductive material 114, the optional dielectric material 112, the another dielectric material 110, the another conductive material 108, and the open volume 118 of one select device 102 shown in FIG. 1A. Spacers 116 may be disposed on the conductive material 114, overlying sidewalls 132 of the another conductive material 108, the another dielectric material 110, and the optional dielectric material 112. By way of non-limiting example, the open volume 118 may have an average depth, which is depicted as Å, of between about 5 Å and about 20 Å, and more particularly about 10 Å. The open volume 118 of each select device 102 may, for example, extend into the dielectric material 112', as shown in broken lines in FIG. 1B. The width of the open volume 118, which is depicted as w1, may be selected, for example, based on the composition of the dielectric material 112', and the another dielectric material 110, and based on a thickness of the overlying another conductive material 108. In additional embodiments, the dielectric material 112' may be absent and the open volume 118 may substantially extend between adjacent spacers 116 to form a void between opposing surfaces of the another dielectric material 110 and the conductive material 114.

As the select device 102 is scaled to smaller devices sizes, the edge (i.e., an outer periphery) of the select device 102 forms a greater percentage of the total area of the select device 102 resulting in increased edge leakage, which may have negative effects on the rectifying behavior of the select device 102. To compensate for increased edge leakage, the open volume 118 may be provided, with open volume 118 functioning as a high band gap insulator having a dielectric constant of about one (1). Including the open volume 118 as an insulator in the select device 102 enables smaller scaling of the select devices 102 while minimizing fringe field effects (i.e., edge leakage) and providing a select device 102 exhibiting a larger asymmetrical current and an enhanced rectifying behavior.

Figure 2:
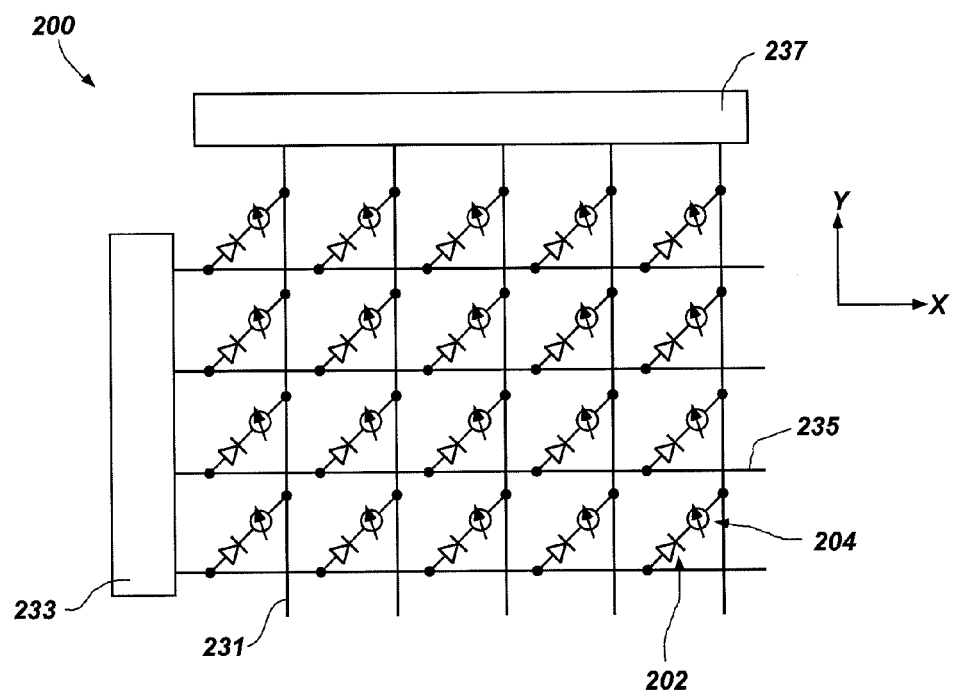
FIG. 2 is a diagram of a memory device of the present invention in which select devices according to the present invention are disposed in a simple matrix form.

As shown in FIG. 2, the memory device 200 may include an array of memory cells 204, each of which is coupled to a select device 202 arranged in a simple matrix form, for selectively writing information to the array of memory cells 204, or selectively reading information from the array of memory cells 204, and various circuits that include, for example, a first electrode 231, a first drive circuit 233 for selectively controlling the first electrode 231, a second electrode 235, a second drive circuit 237 for selectively controlling the second electrode 235, and a signal detection circuit (not shown).

The first electrodes 231 may substantially function as wordlines for line selection and second electrodes 235 may substantially function as bit lines for a row selection arranged orthogonally to the first electrodes 231. Specifically, the first electrodes 231 are arranged in a major plane of memory device 200 at a predetermined pitch in direction X and the second electrodes 235 are arranged at a predetermined pitch in direction Y orthogonal to direction X. In additional embodiments, the first and second electrodes 231 and 235, respectively, may be reversed so that first electrodes 231 may substantially function as bit lines while the second electrodes 235 substantially function as wordlines.

Figure 3A:
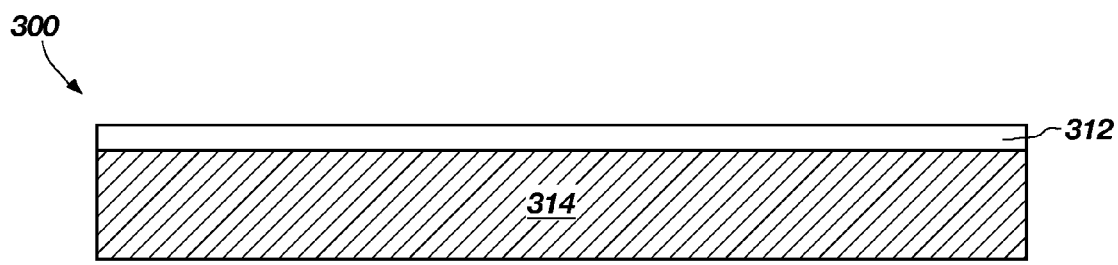
FIGS. 3A-3F are partial cross-sectional side views of embodiments of a workpiece and illustrate an embodiment of a method of forming the select device shown in FIGS. 1A and 1B.

An embodiment of a method that may be used to form a select device 102 such as that shown in FIG. 1 is described with reference to FIGS. 3A-3F. Referring to FIG. 3A, a workpiece 300 may be provided, which includes a conductive material 314 and a dielectric material 312. The conductive material 314 may comprise a metal having a low work function such as, for example, tantalum silicide ($TaSi_2$), an alloy of tantalum and silicon, an alloy of tantalum and nitrogen, and may be formed using, for example, metal layer deposition techniques (e.g., chemical vapor deposition (CVD), physical vapor deposition (PVD), sputtering, thermal evaporation, or plating) as known in the art of integrated circuit fabrication. In some embodiments, the conductive material 314 may be formed over a substrate (not shown) which, as previously described, may comprise a full or partial wafer of semiconductor material or a material such as glass or sapphire. Additional features, such as, for example, conductive lines (which may simply comprise conductive pads in additional embodiments) and electrical contacts, also may be formed on or in the surface of the substrate in a similar manner (prior and/or subsequent to forming the conductive material 314), although a substrate including such additional features is not illustrated in FIGS. 3A-3F in order to simplify the figures.

The dielectric material 312 may be provided over the workpiece 300 (i.e., over an exposed major surface of the conductive material 314) and may have a thickness of less than about 1 nm and, more particularly, between about 5 Å and about 20 Å. By way of example and not limitation, the dielectric material 312 may comprise a material having a dielectric constant ($\in$) of between about 2 to about 10, and having a band gap of between about 6 eV and about 10 eV. For example, the dielectric material 312 may include an oxide such as silicon dioxide ($SiO_2$), a nitride such as silicon nitride ($Si_3N_4$), amorphous carbon, or aluminum oxide ($Al_2O_3$), and may be formed using a chemical vapor deposition (CVD) process, by decomposing tetraethyl orthosilicate (TEOS), by a spin-on process, or by any other process known in the art of integrated circuit fabrication.

Figure 3B:
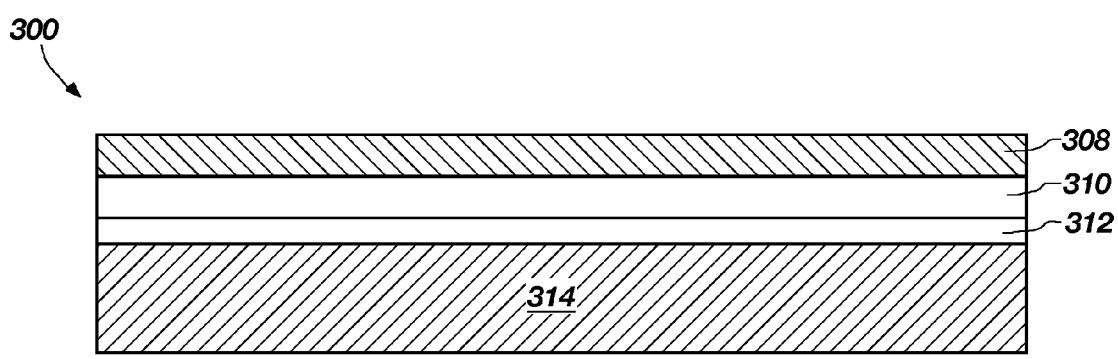

Referring to FIG. 3B, another dielectric material 310 may be formed over and in contact with the dielectric material 312. The another dielectric material 310 may include, for example, a crystalline material and include hafnium, zirconium, titanium, tellurium, oxides thereof, combinations thereof, and alloys thereof. By way of non-limiting example, the another dielectric material 310 may be formed to have a thickness of between about 2 nm and about 8 nm and, more particularly about 5 nm, using a conventional process such as an atomic layer deposition (ALD) process, a chemical vapor deposition (CVD) process, or a physical vapor deposition (PVD) process. In some embodiments, the another dielectric material 310 may include multiple layers (not shown) that may be, for example, deposited using an atomic layer deposition (ALD) process to form a laminated or sandwiched structure.

Another conductive material 308 may be formed over the another dielectric material 310 and may comprise, for example, a metal having a high work function such as platinum, titanium, titanium nitride, rhodium, iridium, ruthenium, combinations thereof, and alloys thereof. The another conductive material 308 may have an average thickness of between about 5 nm to about 30 nm and, more particularly, about 10 nm to about 20 nm, may be formed by using, for example, a physical vapor deposition (PVD) process (e.g., sputtering or thermal evaporation), a chemical vapor deposition (CVD) process, an electroless deposition process, or an electroless deposition process used to form a seed layer followed by a subsequent electroplating process.

Figure 3C:
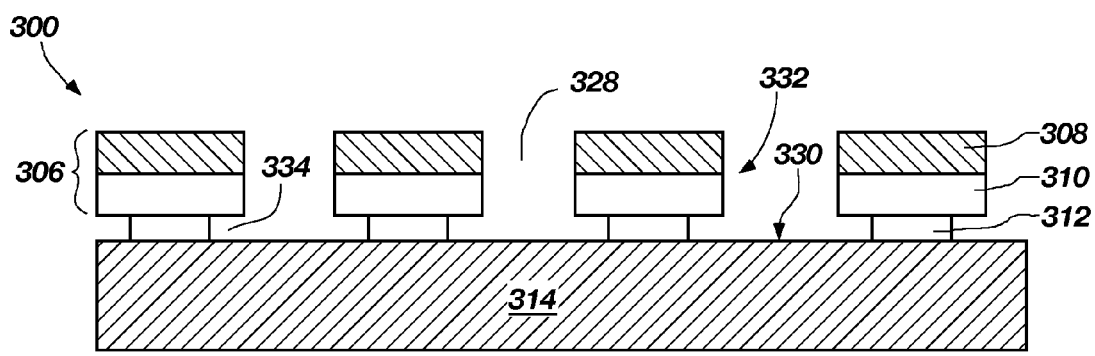

As shown in FIG. 3C, openings 328 may be formed through the another conductive material 308, the another dielectric material 310, and the dielectric material 312 forming structures 306 and exposing sidewalls 332 of each of the another conductive material 308, the another dielectric material 310, and the dielectric material 312. Although FIG. 3C shows a plurality of openings 328 to simplify the cross-sectional figures, a single opening 328 may be formed. As a non-limiting example, each of the openings 328 may be formed by removing a portion of each of the another conductive material 308, the another dielectric material 310, and the dielectric material 312 through an aperture in a mask (not shown) using, for example, an anisotropic dry reactive ion (i.e., plasma) etching process. The mask may be, for example, a photoresist material or a dielectric anti-reflective coating (DARC) material. Removal of a portion of each of the another conductive material 308, the another dielectric material 310, and the dielectric material 312 may expose a surface 330 of the conductive material 314. The particular composition of the etchant used to form the openings 328 may be selected based on the composition of the another conductive material 308, the another dielectric material 310, the dielectric material 312, the conductive material 314, and the mask. As a non-limiting example, the another conductive material 308 may be platinum, the another dielectric material 310 may be amorphous carbon, the dielectric material 312 may be silicon dioxide, and the conductive material 314 may be tantalum nitride. A chlorine-containing etchant may be introduced to be used to selectively remove the another conductive material 308, the another dielectric material 310, the dielectric material 312 through apertures in the mask forming the openings 328.

Referring still to FIG. 3C, another portion of the dielectric material 312 may be removed to form undercuts 334 in the dielectric material 312, each of the undercuts 334 exposing opposing surfaces of the another dielectric material 310 and the conductive material 314. The undercuts 334 may be formed using an anisotropic wet etching process or an anisotropic dry (i.e., reactive ion) etching process. By way of non-limiting example, the another conductive material 308 is platinum, the another dielectric material 310 is hafnium oxide, and the dielectric material 312 is silicon dioxide, and the conductive material 314 is tantalum nitride, and a solution including water and hydrofluoric acid at a ratio of between about 500:1 and about 100:1 may be applied to the sidewalls 332 to form undercuts 334 in the silicon dioxide. Additionally, the dielectric material 312 may be formed from amorphous carbon and may be exposed to an oxygen plasma to form the undercuts 334 therein.

Figure 3D:
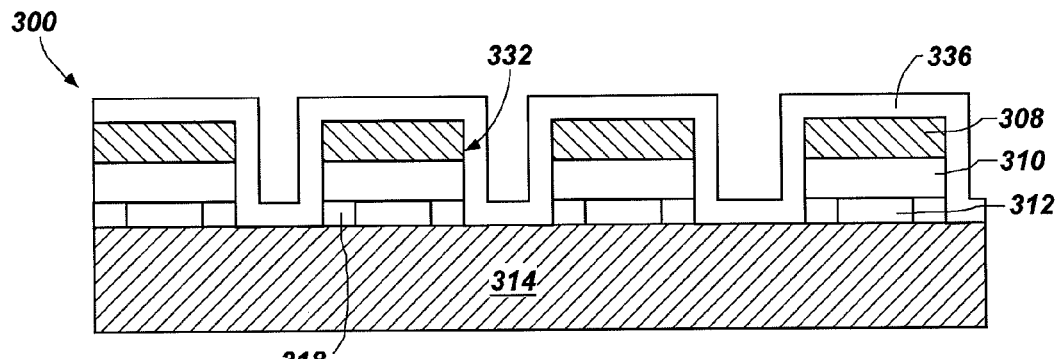

As shown in FIG. 3D, after forming the undercuts 334, a spacer material 336 may be deposited over the workpiece 300 (i.e., over exposed surfaces of the another conductive material 308 and the conductive material 314 and over sidewalls 332 of the openings 328) to form an open volume 318 defined by surrounding surfaces of the spacer material 336, the dielectric material 312, the another dielectric material 310 and the conductive material 314. The spacer material 336 may include, for example, silicon dioxide or silicon nitride and may be formed using an atomic layer deposition (ALD) process, or a chemical vapor deposition (CVD) process. By way of example and not limitation, a conformal layer (not shown) of the spacer material 336 may be deposited over the workpiece 300 to a thickness sufficient to provide support for the open volume 318.

Figure 3E:
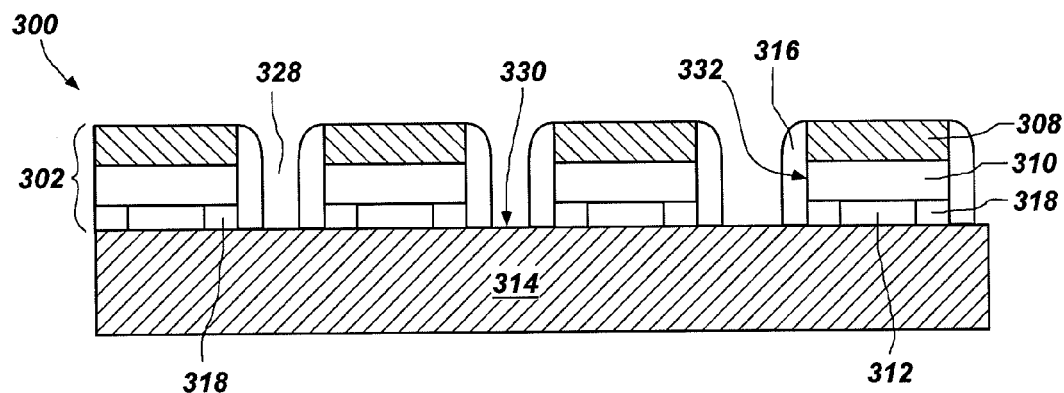

A portion of the spacer material 336 may then be removed to form spacers 316 disposed about a periphery of select devices 302, such as those shown in FIG. 3E. The spacers 316 may be formed using a conventional anisotropic etching process, which is not described in detail herein. As a non-limiting example, the spacer material 336 may include silicon nitride and a plasma etching process may be performed using a mixture of hydrogen bromide (HBr) and sulfur hexafluoride ($SF_6$) to form spacers 316 laterally sealing the open volume 318. Each of the spacers 316 may extend from the surface 330 of the conductive material 314 overlying sidewalls 332.

Figure 3F:
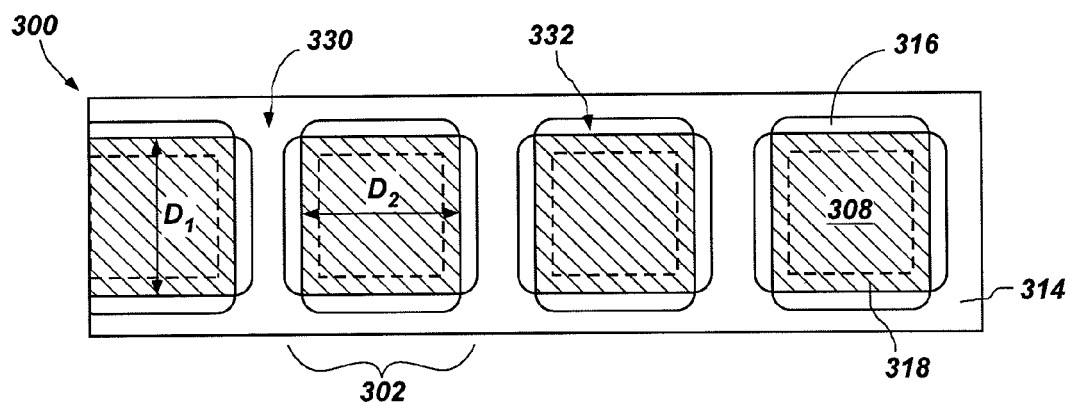

FIG. 3F shows a top-down view of the workpiece 300 shown in FIG. 3E, which includes a plurality of select devices 302, each of the select devices 302 including portions of the another conductive material 308, the dielectric material 312 (not visible) and the another dielectric material 310 (not visible), which are disposed over the conductive material 314. The open volume 318, which is represented in FIG. 3F by broken lines, is disposed about an outer periphery of the another conductive material 308. Each of the select devices 302 may have lateral dimensions $D_1$ and $D_2$ of between about 25 nm and about 75 nm and, and more particularly, about 50 nm. Spacers 316 are positioned on the surface 330 of the conductive material 314 overlying sidewalls 332.

Formation of the open volume 318 provides an insulator having a dielectric constant ($\in$) of about 1, which facilitates formation of select devices 302 having enhanced rectifying behavior, even at smaller device sizes. The processes utilized in the formation of the open volume 318 may be performed at sufficiently low temperatures so as to prevent chemical intermixing between the dielectric materials (i.e., the another dielectric material 310 and the dielectric material 312) and the conductive materials (i.e., the another conductive material 308 and the conductive material 314).

Figure 4A:
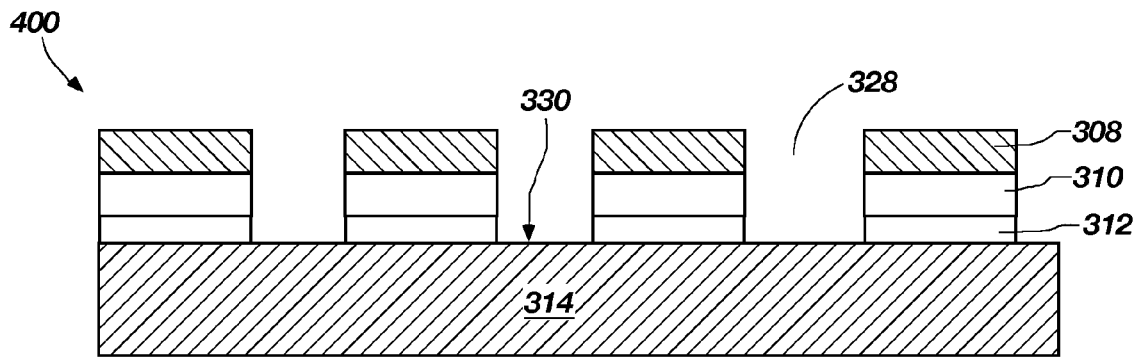
FIGS. 4A-4F are partial cross-sectional side views of embodiments of a workpiece and illustrate another embodiment of a method of forming the select device shown in FIGS. 1A and 1B.

Another embodiment of a method that may be used to form a select device 102 such as that shown in FIGS. 1A and 1B is described below with reference to FIGS. 4A-4F. As shown in FIG. 4A, a workpiece 400 may be provided that includes openings 328 formed exposing a surface 330 of a conductive material 314 through a dielectric material 312, and another dielectric material 310, and another conductive material 308. The workpiece 400 shown in FIG. 4A may be formed in the manner previously described with reference to FIGS. 3A-3C.

Figure 4B:
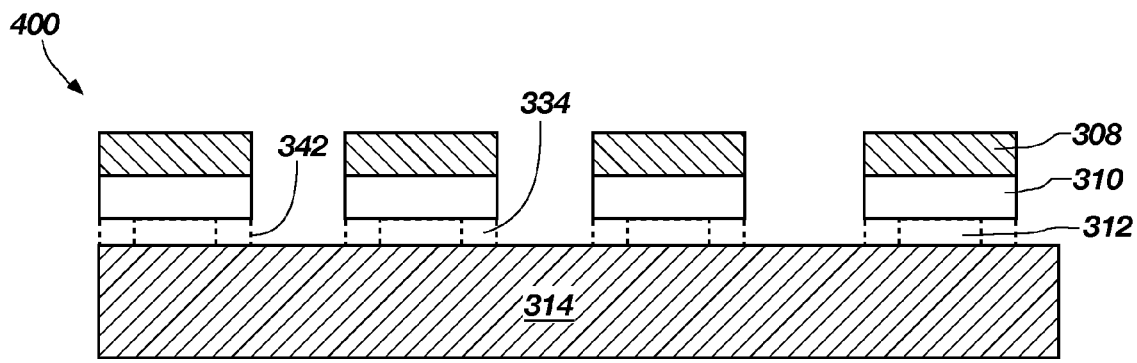

Referring to FIG. 4B, another portion of the dielectric material 312 may, optionally, be removed to form undercuts 334 in the dielectric material 312 using methods identical or substantially similar to those previously described in relation to FIG. 3C. Thereafter, a sacrificial material 342, which is represented by broken lines, may optionally be applied to at least partially fill each of the undercuts 334. By way of non-limiting example, the sacrificial material 342 may be formed from a hard mask material, such as amorphous carbon, and may be deposited using conventional methods such as an atomic layer deposition (ALD) process.

Figure 4C:
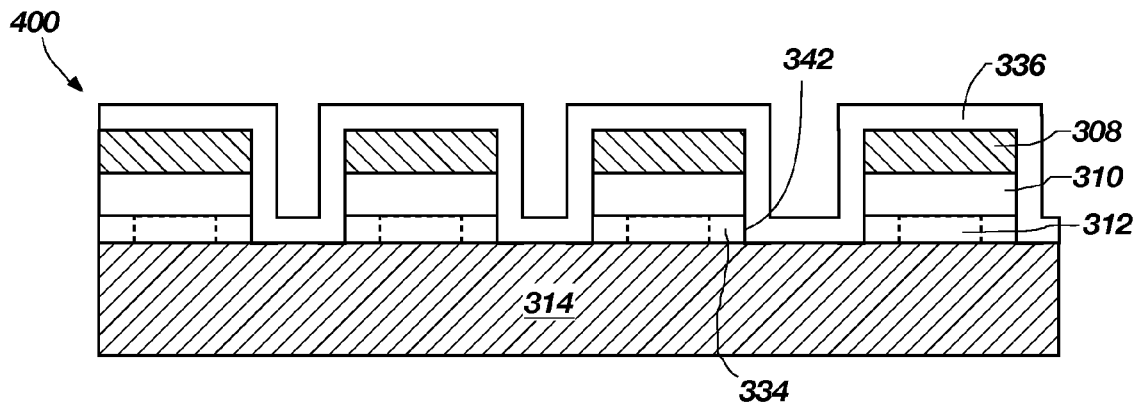
Figure 4D:
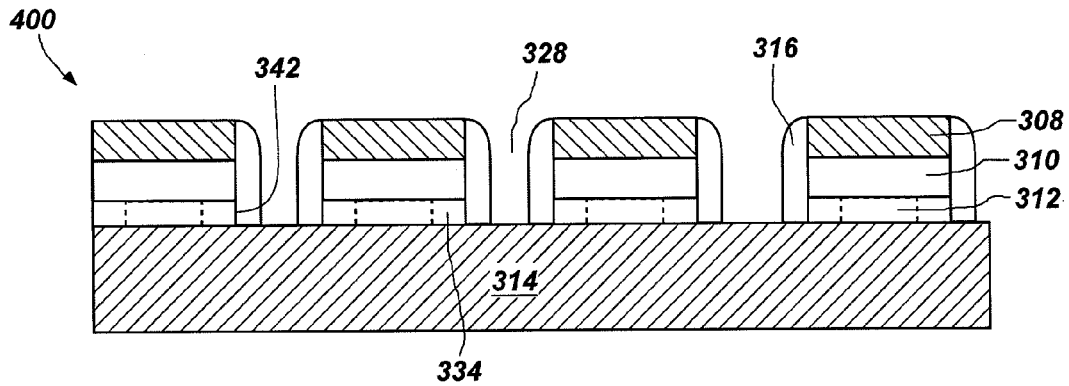

As shown in FIG. 4C, after forming openings 328 and, optionally, forming undercuts 334 and filling the undercuts 334 with the sacrificial material 342, a spacer material 336 may be applied over the workpiece 400. By way of non-limiting example, the spacer material 336 may include silicon dioxide or silicon nitride, and may be formed using an atomic layer deposition (ALD) process, or a chemical vapor deposition (CVD) process. During deposition of the spacer material 336, the optional sacrificial material 342 may prevent the spacer material 336 from being deposited in the optional undercuts 334. A conventional spacer etch may then be performed, as previously described with respect to FIG. 3E, to form the workpiece 400 including spacers 316 as shown in FIG. 4D. The spacers 316 may cover the another conductive material 308, the another dielectric material 310, and either the dielectric material 312 or the sacrificial material 342, filling the optional undercuts 334 exposed along the sidewalls 332 of the openings 328.

Figure 4E:
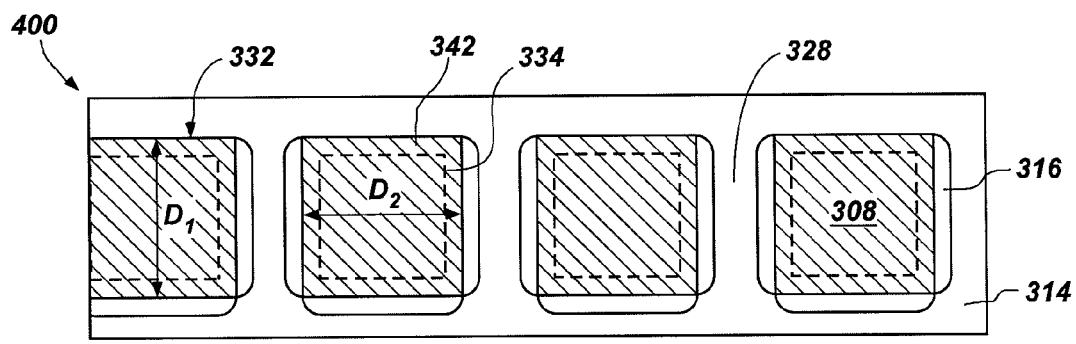

Referring to FIG. 4D, after forming the spacers 316, at least one of the spacers 316 may be removed from the sidewalls 332 to expose a portion of the dielectric material 312 or, if present, a portion of the sacrificial material 342, which is represented by broken lines. Removal of at least one of the spacers 316 may be performed by way of conventional patterning techniques (e.g., masking and etching), which are not described in detail herein. By way of non-limiting example, a mask (not shown) may be applied and selectively patterned to expose a surface of at least one of the spacers 316 through the mask, and at least one of the spacers 316 may be removed using, for example, a wet chemical etching process. FIG. 4E is a top-down view of the workpiece 400 shown in FIG. 4F after removal of one of the spacers 316 to expose at least one of the sidewalls 332.

Figure 4F:
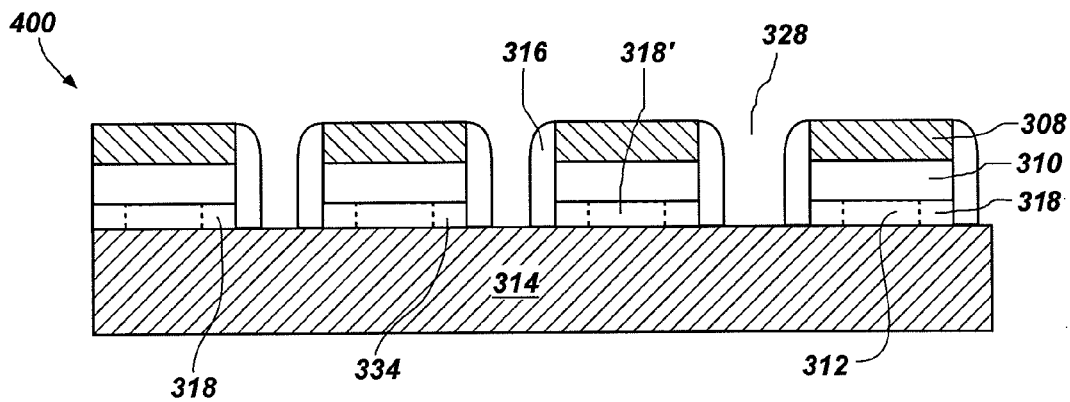

Referring to FIG. 4F, subsequent to removal of at least one of the spacers 316, exposed portions of the sacrificial material 342, if present, and the dielectric material 312 may be removed to form an open volume 318. As a non-limiting example, an anisotropic dry reactive ion (i.e., plasma) etching process may be used to selectively remove the sacrificial material 342 (FIGS. 4D and 4E) without removing the dielectric material 312 to form the open volume 318 extending only partially into the dielectric material 312, as represented by broken lines. Additionally, the dielectric material 312 may be substantially completely removed using, for example, an anisotropic dry reactive ion (i.e., plasma) etching process so as to form an open volume 318' exposing opposing surfaces of the dielectric material and the another metal between the spacers 316.

Figure 5A:
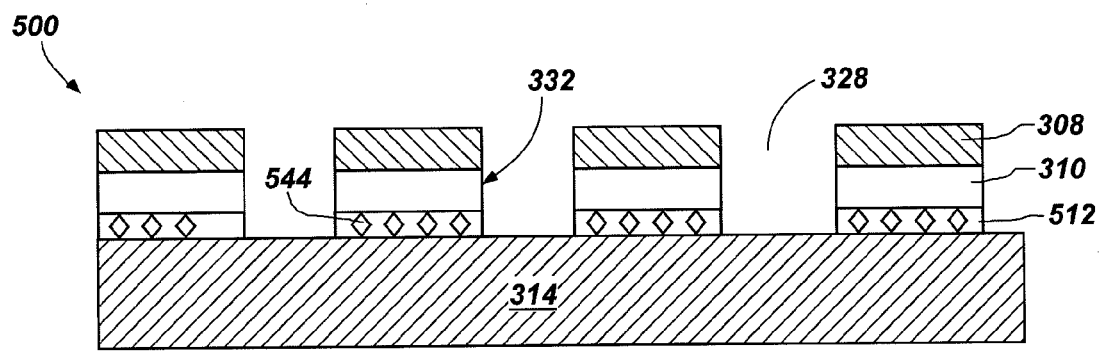
FIGS. 5A-5C are partial cross-sectional side views of embodiments of a workpiece and illustrate yet another embodiment of a method of forming the select device shown in FIGS. 1A and 1B.

Yet another embodiment of a method that may be used to form an embodiment of a select device 102, such as that shown in FIGS. 1A and 1B, is described below with reference to FIGS. 5A-5C. Referring to FIG. 5A, a workpiece 500 may be provided, which includes a conductive material 314, a dielectric material 512, another dielectric material 310, and another conductive material 308. The conductive material 314 may include a metal having a low work function such as those previously described with respect to FIG. 3A. The dielectric material 512 may include an oxide such as silicon dioxide ($SiO_2$), a nitride such as silicon nitride ($Si_3N_4$), amorphous carbon, or aluminum oxide ($Al_2O_3$), and may include a plurality of nanodots 544, which may be distributed throughout the dielectric material 512. The nanodots 544 may include, for example, silicon particles or metal particles having an average diameter of between about 5 Å and about 20 Å.

With continued reference to FIG. 5A, the another dielectric material 310 and the conductive material 308 may be formed over the workpiece 500, and plurality of openings 328 may be formed using methods identical or substantially similar to those previously described in relation to FIGS. 3B and 3C.

Figure 5B:
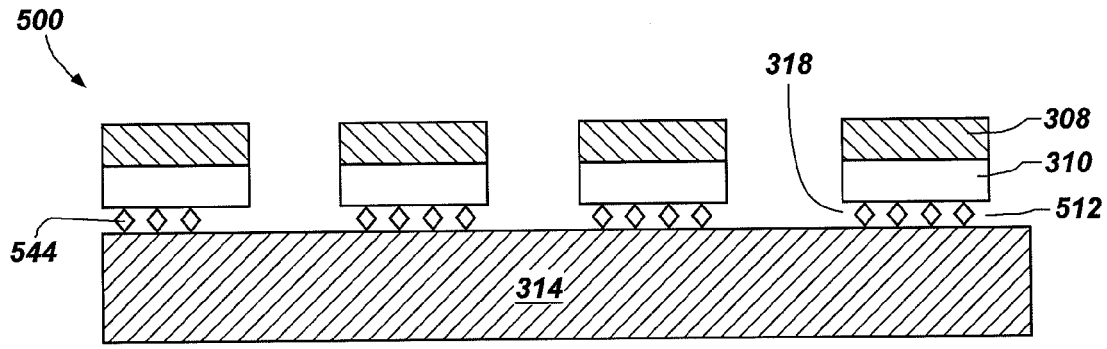

As shown in FIG. 5B, the dielectric material 512 may be removed so that the nanodots 544 support overlying portions of the another dielectric material 310 and the conductive material 308. By way of non-limiting example, the dielectric material 512 is amorphous carbon, the nanodots 544 are formed from a metal, and the carbon may be removed using an anisotropic oxygen plasma etch, while the nanodots 544 remain between surfaces of the another dielectric material 310 and the another conductive material 314. Removal of the dielectric material 512 results in the formation of open volume 318, which may function as an insulator having a dielectric constant of about 1 to reduce parasitic capacitance.

Figure 5C:
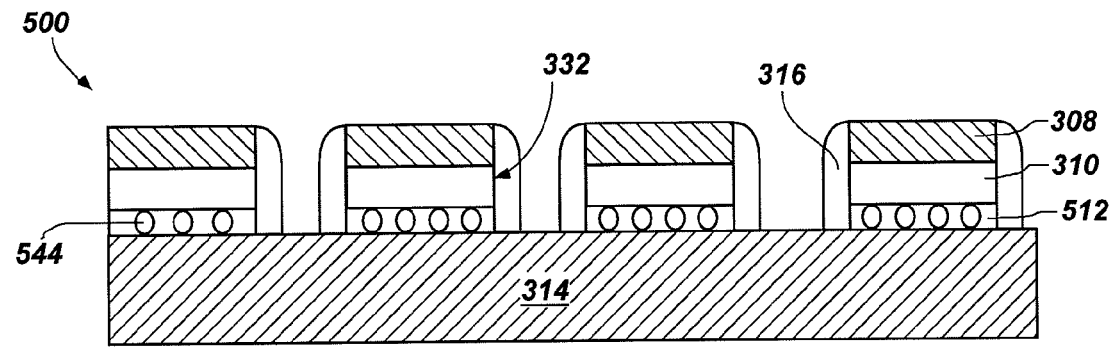

Referring to FIG. 5C, spacers 316 may be formed over the sidewalls 332 of the another conductive material 308, the another dielectric material 310, the dielectric material 312 using methods previously described with respect to FIG. 3E to enclose and provide additional support for the open volume 318.

Example

Figure 6:
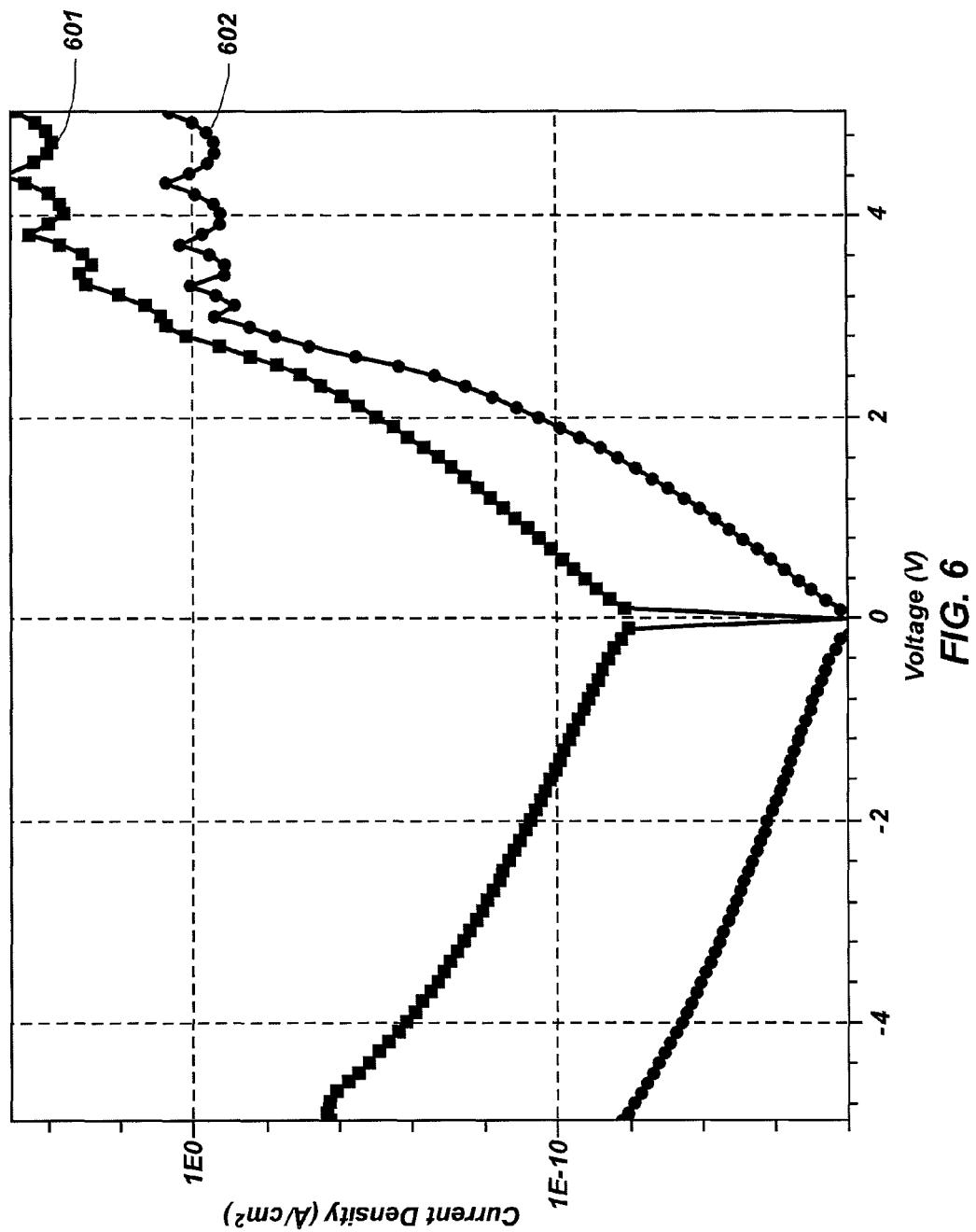
FIG. 6 is a graph showing a comparison between a current-voltage (I-V) relationship for a select device of the present invention and a conventional select device.

FIG. 6 shows a comparison of voltage-current density characteristics of a conventional select device 601 and of a select device including an open volume 602, such as the select device (102) shown in FIGS. 1A and 1B. Each of the select devices 601 and 602 may include a first electrode and a second electrode, which are spaced-apart from one another by a first insulator and a second insulator. The first insulator may be disposed over the second electrode, and the second insulator may be disposed between the first insulator and the first electrode. The first electrode may include a metal having a work function of about 4.40, the second electrode may include a metal having a work function of about 5.25, and the second insulator may include a nanolaminate dielectric comprising hafnium oxide ($HfO_2$) and zirconium oxide ($ZrO_2$). The conventional select device 601 may include a first insulator comprising silicon dioxide and, in contrast, the select device 602 may include a first insulator comprising an open volume.

When driving voltages are the same as applied to both select devices, current density of select device 601 is larger than that of select device 602. In other words, when current densities are the same, driving voltage of select device 602 is smaller than that of select device 601. In forward bias, a quantum well may form between the first insulator and the second insulator resulting in the forward curves shown in FIG. 6. For select device 602, the forward curve exhibits a dramatically sharper nonlinear current-voltage characteristic in comparison to the forward curve for select device 601, demonstrating decreased resistance and increased rectifying behavior. Therefore, utilizing an open volume as a first insulator in a select device results in a select device exhibiting increased nonlinearity and a highly asymmetric current-voltage characteristic.

While the invention may be susceptible to various modifications and alternative forms, specific embodiments have been shown by way of example in the drawings and have been described in detail herein. However, it should be understood that the invention is not limited to the particular forms disclosed. Rather, the invention encompasses all modifications, variations and alternatives falling within the scope of the invention as defined by the following appended claims and their legal equivalents.

What is claimed is:

1. A method of forming a select device, comprising:
    forming at least one opening extending through a conductive material, a dielectric material, and another dielectric material and exposing a surface of a metal underlying an entire length of the dielectric material to form a plurality of discrete structures on the surface of the metal;
    removing a portion of the another dielectric material to form at least one undercut comprising an open volume extending under a portion of the dielectric material of each of the plurality of discrete structures; and
    forming spacers over sidewalls of each of the plurality of discrete structures to enclose the open volume.

2. The method of claim 1, wherein forming the at least one opening comprises:
    forming at least one aperture in a mask material to expose a surface of the conductive material, the conductive material overlying the dielectric material, the another dielectric material and the metal, the metal having a work function lower than a work function of the conductive material; and
    removing a portion of each of the conductive material, the dielectric material, and the another dielectric material through the at least one aperture to form the at least one opening exposing a surface of the metal.

3. The method of claim 1, wherein removing a portion of the another dielectric material to form at least one undercut comprising an open volume extending under a portion of the dielectric material of each of the plurality of discrete structures comprises performing an isotropic etch to undercut the another dielectric material with respect to the conductive material, the dielectric material, and the metal.

4. The method of claim 3, wherein performing an isotropic etch to undercut the another dielectric material with respect to the conductive material, the dielectric material, and the metal comprises undercutting the another dielectric material to form the at least one undercut comprising the open volume extending laterally from about 1 nm to about 10 nm under the dielectric material.

5. The method of claim 1, wherein removing a portion of the another dielectric material to form at least one undercut comprising an open volume extending under a portion of the dielectric material of each of the plurality of discrete structures comprises removing a portion of at least one of silicon dioxide, amorphous carbon, and aluminum oxide to form the at least one undercut.

6. The method of claim 1, wherein forming spacers over sidewalls of each of the discrete structures of the plurality comprises:
    depositing a spacer material substantially conformally over the sidewalls of each of the discrete structures of the plurality and over the conductive material and the metal; and
    removing a portion of the spacer material to expose surfaces of the conductive material and surfaces of the metal between each of the spacers.

7. The method of claim 1, further comprising filling the at least one undercut with a sacrificial material prior to forming the spacers over the sidewalls of the plurality of discrete structures.

8. The method of claim 7, further comprising removing the sacrificial material in the at least one undercut after forming the spacer over the sidewalls of the discrete structures of the plurality.

9. A method of forming a select device, comprising:
    forming at least one structure comprising a conductive material overlying a dielectric material and another dielectric material, the at least one structure extending from a surface of a metal underlying an entire length of the another dielectric material;
    removing a portion of the another dielectric material underlying the dielectric material to form an open volume between opposing surfaces of the dielectric material and the metal; and
    forming spacers over sidewalls of the at least one structure bounding the open volume.

10. The method of claim 9, further comprising:
    applying a hard mask material to fill the open volume before forming the spacers;
    removing at least one of the spacers to expose the hard mask material; and
    removing the hard mask material.

11. The method of claim 10, wherein the hard mask material comprises amorphous carbon.

12. The method of claim 9, wherein forming at least one structure comprising a conductive material overlying a dielectric material and another dielectric material comprises:
    applying a conductive material comprising at least one metal over the metal, the metal having a work function lower than a work function of the conductive material; and
    removing a portion of the conductive material, the another dielectric material and the dielectric material to form an opening exposing surfaces of the metal.

13. The method of claim 9, wherein removing a portion of the another dielectric material underlying the dielectric material to form an open volume comprises laterally removing a portion of the another dielectric material to form an undercut therein.

14. The method of claim 9, wherein forming spacers over sidewalls of the at least one structure bounding the open volume comprises:
    depositing a spacer material over the sidewalls of the at least one structure and surfaces of the conductive material and the metal; and
    performing an anisotropic etching process to remove a portion of the spacer material forming spacers flanking the sidewalls of the at least one structure.

15. A method of forming a select device, comprising:
    forming a plurality of openings extending through a metal, a dielectric material, and another dielectric material and exposing a surface of another metal underlying an entire length of the another dielectric material;
    applying a spacer material over sidewalls of structures adjacent each of the plurality of openings and over surfaces of the metal and the another metal;
    removing a portion of the spacer material to expose a portion of the another dielectric material of the structures; and removing at least a portion of the another dielectric material to form an open volume between opposing surfaces of the dielectric material and the another metal.

16. The method of claim 15, further comprising etching a portion of the spacer material to form spacers on the sidewalls of the structures.

17. The method of claim 15, wherein removing at least a portion of the another dielectric material to form an open volume between opposing surfaces of the dielectric material and the another metal comprises substantially completely removing the another dielectric material.

18. A method of forming a select device, comprising:
forming at least one structure defined by sidewalls of a conductive material, a first dielectric material, and a second dielectric material, the at least one structure extending from a surface of a metal underlying and contacting an entire length of the second dielectric material;
removing material from a portion of the sidewalls defined by the second dielectric material without substantially removing material of the sidewalls defined by the overlying first dielectric material to form an open volume between opposing surfaces of the first dielectric material and the metal; and
enclosing the open volume of the at least one structure with a third dielectric material.

19. The method of claim 18, further comprising forming the second dielectric material over the metal, the first dielectric material over the second dielectric material and the conductive material over the first dielectric material.

20. The method of claim 19, wherein forming the second dielectric material over the metal, the first dielectric material over the second dielectric material and the conductive material over the first dielectric material comprises forming the second dielectric material from a material selectively etchable with respect to the first dielectric material.

* * * * *